(12) United States Patent
Robb et al.

(10) Patent No.: US 6,949,961 B2
(45) Date of Patent: Sep. 27, 2005

(54) POWER SWITCH STRUCTURE WITH LOW $R_{DSON}$ AND LOW CURRENT LIMIT

(75) Inventors: Stephen P. Robb, Fountain Hills, AZ (US); David K. Briggs, Glendale, AZ (US)

(73) Assignee: Semiconductor Components Industries, L.L.C., Phoenix, AZ (US)

(*) Notice: Subject to any disclaimer, the term of this patent is extended or adjusted under 35 U.S.C. 154(b) by 23 days.

(21) Appl. No.: 10/678,769

(22) Filed: Oct. 6, 2003

(65) Prior Publication Data

US 2005/0072987 A1 Apr. 7, 2005

(51) Int. Cl.[7] .................. H01L 29/94; H01L 31/062; H01L 31/113; H01L 31/119
(52) U.S. Cl. .................. 327/52; 327/54; 327/56; 327/87; 257/341
(58) Field of Search .................. 327/3, 5, 7, 52, 327/54, 56, 87; 257/341

(56) References Cited

U.S. PATENT DOCUMENTS

| 5,986,941 A | * 11/1999 | Pang et al. ............. 365/185.33 |
| 6,261,907 B1 | * 7/2001 | Chang ....................... 438/266 |
| 6,515,463 B2 | 2/2003 | Ling |

* cited by examiner

*Primary Examiner*—Ngân V. Ngô
(74) *Attorney, Agent, or Firm*—Kevin B. Jackson

(57) ABSTRACT

In one embodiment, a power switch device (33) includes a first MOSFET device 41 and a second MOSFET device (42). A split gate structure (84) including a first gate electrode (48,87) controls the first MOSFET device (41). A second gate electrode (49,92) controls the second MOSFET device (42). A current limit device (38) is coupled to the first gate electrode (48,97) to turn on the first MOSFET device during a current limit mode. A comparator device (36) is coupled to the second gate electrode (49,92) to turn on the second MOSFET device (42) when the power switch device (33) is no longer in current limit mode.

11 Claims, 7 Drawing Sheets

US 6,949,961 B2

POWER SWITCH STRUCTURE WITH LOW $R_{DSON}$ AND LOW CURRENT LIMIT

BACKGROUND OF THE INVENTION

This invention relates generally to power semiconductor systems, and more specifically to power semiconductor devices for limiting current surges on power bus lines.

In telecommunication, network and computer systems, it is often desired to plug or unplug electronic circuit cards from their power source without removing power from the system. This is typically referred to as "hot swapping" or "hot plugging". During hot swapping events, it is desired to minimize power bus transients, and at the same time, protect both the card and the system from transients that may occur despite precautions.

To protect cards and systems from transients and faults, other circuits typically are inserted in the power lines to detect faults and respond in a way that prevents faulty operation or damage. In a typical configuration, a power semiconductor device, such as a power MOSFET, is coupled into the power line in series with load capacitors and circuits on the circuit card. Control circuitry is included to sense voltage and current in order to detect faults in the system. The control circuitry can then turn on or turn off the power semiconductor device in response to the sensed signals, which protects the system. Such circuits are commonly referred to as "hot swap" or "hot plug" circuits or devices.

Once a card is plugged into the system and its power MOSFET device is fully turned on, power bus current passes through the power MOSFET and into a load device. If no faults occur, the power MOSFET may remain in an on state for an extended period of time. In this case, it is important that the power MOSFET device have a low drain to source resistance (i.e., on resistance ($R_{DSon}$)) to minimize power dissipation and voltage drop on the power bus.

In addition, it is important that the protective circuitry provide a very low current limit to prevent a large inrush current, which can occur when a card is plugged into a system. The current limit is used to more slowly charge load capacitances when the card is first plugged in, and to prevent large inrush currents in the event of a shorted load after the card is plugged in.

Present power MOSFET designs use dense cell geometries to achieve low $R_{DSon}$, which results in a device with a very large gain ($G_m$). In order to limit current on a device with a very large gain, gate voltage ($V_{gs}$) must be reduced to level that is very near threshold voltage ($V_{th}$). When $V_{gs}$ is close to $V_{th}$, drain saturation current ($I_{DSAT}$) increases with temperature (i.e., $I_{DSAT}$ has a positive temperature coefficient). This effect can result in "hot spot" formation and thermal runaway, which can lead to device and ultimately system failure.

Accordingly, a need exists for a power switching device that has low on resistance and low current limit capability (i.e., low $I_{DSAT}$), and that is more robust against the effects of hot spot formation and thermal runaway.

DETAILED DESCRIPTION OF THE DRAWINGS

In general, the present invention pertains to electronic systems where it is desired to plug and/or unplug printed circuit cards without powering the system down. In particular, the present invention includes a power switching device having more than one separately controlled gate electrode. Under an inrush current condition, one gate electrode is used to turn on a portion of the power MOSFET device to provide a more optimum current limiting device. Under steady-state conditions, an additional and separate gate electrode is used to turn on the balance of the power MOSFET device to provide a low on resistance characteristic.

Figure 1:
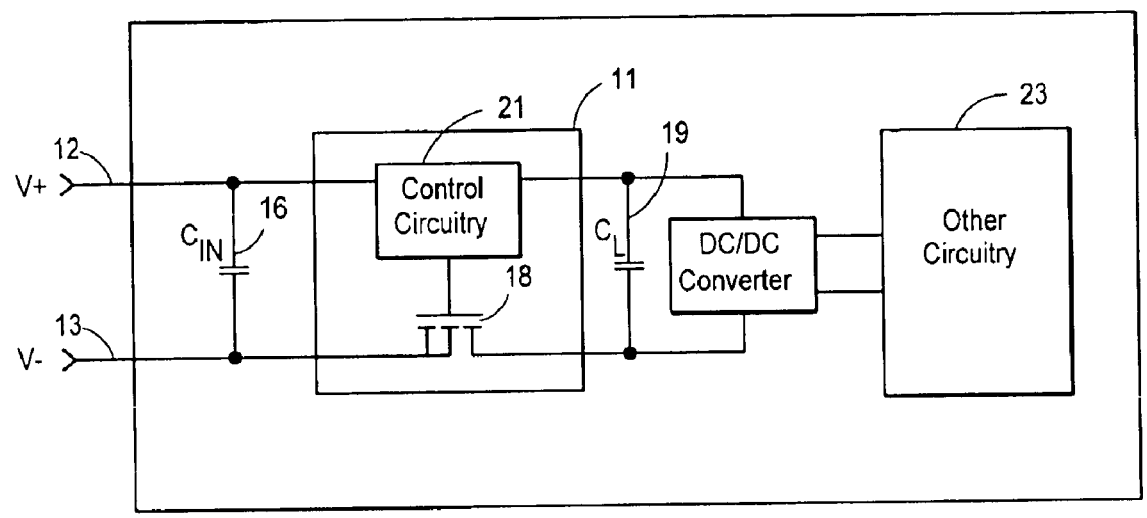
FIG. 1 illustrates a simplified circuit diagram of a prior art circuit card having a hot swap protection device.

FIG. 1 shows a simplified diagram of a prior art circuit card 10 including a hot swap protection device or inrush current limiter device 11. Card 10 is intended for plugging and/or unplugging into an electronic system (not shown) while power is applied between a distributed power bus 12 and a ground node 13. Power bus 12 and ground node 13 may be concurrently supplying power to other components (not shown) within the electronic system.

Protection device 11 comprises a power MOSFET 18 having a drain coupled to a load capacitor 19, and a source coupled to ground node 13. Power MOSFET 18 further includes a gate or control electrode that is coupled to control circuitry 21. Power MOSFET 18 operates in response to a control signal from control circuitry 21 to route a load current from the supply voltage to ground node 13 as a protected signal.

When card 10 is connected to power bus 12, hot swap device 11 slowly turns on power MOSFET 18, and the current ramps up as input capacitor 16 is charged. The current is then limited to a pre-determined maximum value until input capacitor 16 is fully charged to prevent a large inrush current from upsetting power bus 13. At this time, power MOSFET 18 is fully turned on and acts as a low resistance pass element to supply power to a load such as DC/DC converter 23.

If a short occurs on card 10, then current will ramp up to a pre-determined current limit, but input capacitor 16 will not fully charge. The circuit will continue to draw high current as determined by the current limit of hot swap device 11. Under this condition, the power dissipation in power MOSFET 18 will cause junction temperature to rise until a thermal limit is reached as monitored by control circuitry 21. Control circuitry 21 then turns power MOSFET 18 off to protect card 10 and the electronic system.

One problem with power MOSFET 18 is that it is incapable of providing low $R_{DSon}$ and a low current limit without risking a thermal runaway situation. To achieve low $R_{DSoN}$, power MOSFET 18 typically has a dense cell geometry. This is a disadvantage because it results in a MOSFET with a very large gain or transconductance (Gm). To limit the current to a low value for a MOSFET with very large gain, the gate voltage must be reduced to very near the transistor's threshold voltage ($V_{th}$). For example, on a typical prior art 100 volt hot swap device with an $R_{DSon}$ of 35 mOhm, the gate voltage ($V_{gs}$) must be reduced to about 2.0 volts in order to limit current to a desired level of 6 amps. In a typical prior 100 volt device, $V_{th}$ is 1.7 volts, and $V_{gs}$ is only about 0.3 volts above $V_{th}$ in a current limit situation.

When power MOSFET 18 is operated in the saturation region where drain current is limited by $V_{gs}$, the temperature coefficient of $I_{DSAT}$ can be positive, zero, or negative. The competing effects are mobility, which decreases with temperature, and $V_{th}$, which also decreases with temperature. Decreasing mobility reduces $I_{DSAT}$, but decreasing $V_{th}$ increases $I_{DSAT}$. When $V_{gs}$ is much greater than $V_{th}$, the mobility effect dominates, and $I_{DSAT}$ decreases with temperature. However, when $V_{gs}$ is close to $V_{th}$, the $V_{th}$ effect dominates, and $I_{DSAT}$ increases with temperature.

When prior art large power MOSFETs (e.g., power MOSFET 18) are limited at a low current level, such devices operate in the region where $I_{DSAT}$ increases with temperature, and $V_{gs}$ is very close to $V_{th}$. This can lead to a thermal runaway situation. If temperature in a region of the power device increases, then current in that region also will increase. This leads to a further increase in temperature, and a further increase in current that causes a "hot spot" to develop. This hot spot can cause power MOSFET 18 and ultimately the system to fail.

Turning now to FIGS. 2–8, the present invention is now presented together with the following detailed description. For ease of understanding, like elements or regions are labeled the same throughout the detailed description and FIGURES where appropriate.

Figure 2:
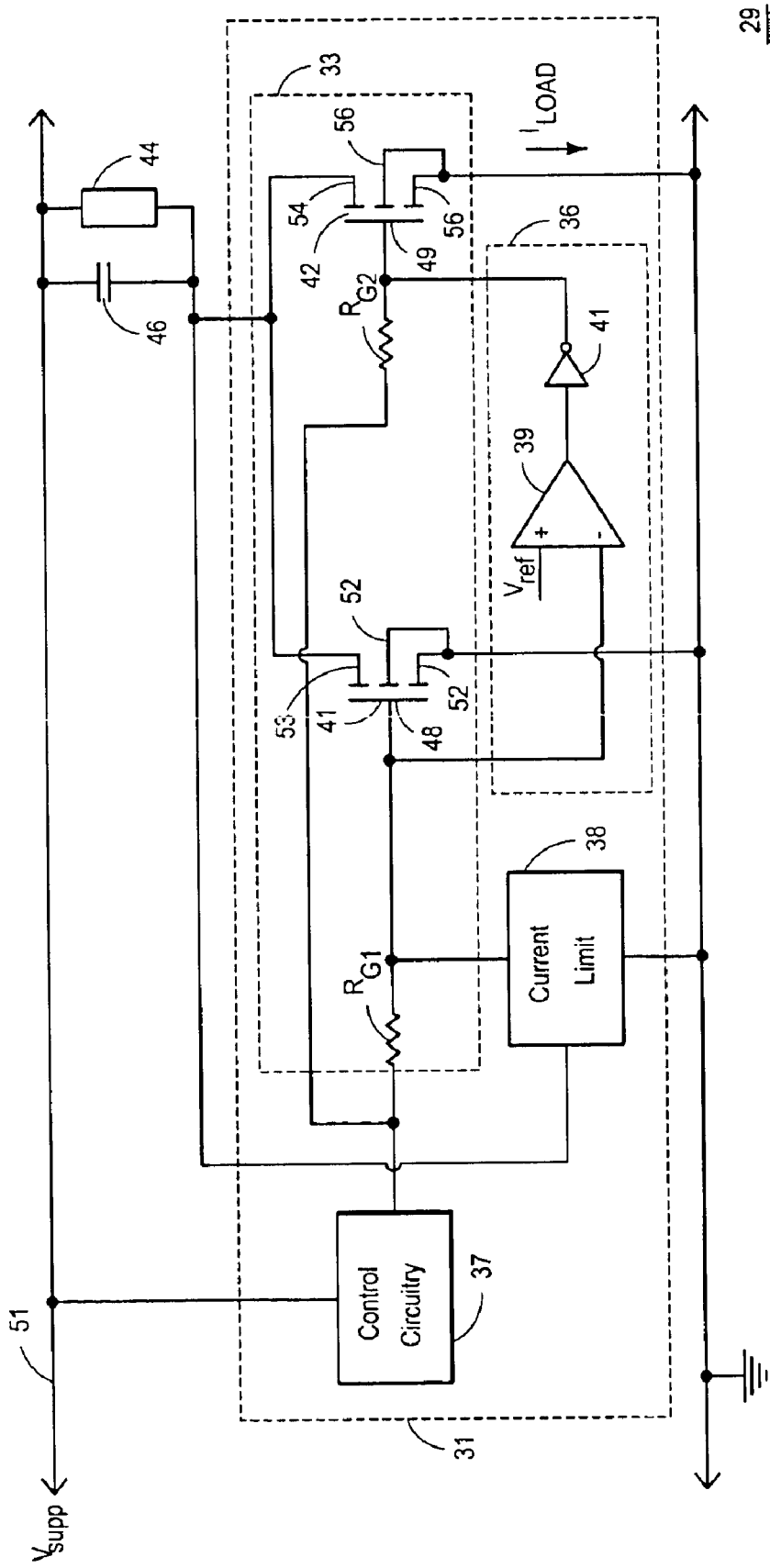
FIG. 2 illustrates a circuit diagram of a hot swap structure according to the present invention.

FIG. 2 shows a circuit schematic of a hot swap structure or device 31 according to the present invention, which is part of a circuit card 29. Structure 31 provides both a low $R_{DSon}$ and a low current limit while reducing the effects of hot spots and thermal runaway. According to the present invention, structure 31 includes a split or multiple gate or control electrode switching device, structure, or power MOSFET device 33. Preferably, switching device 33 includes a first switch 41 for conducting current in a current limit mode, and a second switch 42 that turns on after a predetermined condition (as set, for example, by control circuitry 37), post-current limit mode, or non-current limit mode is met to conduct current with first switch 41 to provide low on resistance. That is, second switch 42 turns on after first switch 41 is fully on (i.e., not in saturation), which is determined or set by $V_{gs}>V_{REF}$. In a preferred embodiment, first and second switches 41 and 42 comprise power MOSFET devices.

According to the present invention, a first gate or control electrode 48 controls current conduction in first switch 41, and a separate or second gate or control electrode 49 controls current conduction in second switch 42. More particularly, first control electrode 48 controls a first pair of current carrying electrodes or regions (e.g., sources 52 and drain 53), and second control electrode 49 controls a second pair of current carrying electrodes or regions (e.g., sources 56 and drain 54).

First switch 41 and second switch 42 each have a common drain 53 and 54 respectively coupled to a load 44 and a filter capacitor 46. Filter capacitor 46 functions to smooth out noise spikes on power bus 51 to provide a more stable biasing. Load 44 comprises, for example, a DC/DC converter that draws a load current $I_{LOAD}$ of about 5 amperes as a peak value through capacitor 46 and load 44. A typical average value of $I_{LOAD}$ is about 3 amperes. By way of example, capacitor 46 has a value of about 1,000 microfarads.

Hot swap structure 31 further includes a current limit device or circuit 38 coupled to control circuitry 37, control electrode 48 of switching device 41, and control electrode 49 of switching device 42. A comparator device 36 including a voltage comparator 39 and an inverter 41 is coupled to control electrodes 48 and 49. Comparator device 36 functions to turn-on control electrode 49 once the $V_{gs}$ at control electrode 48 reaches a certain or pre-determined value (e.g., 5 volts), which corresponds to a non-current limit mode. Control circuitry 37 is coupled to split gate device 33 to turn on or turn off split gate device 33 in response to sensed signals, and comprises, for example, a comparator and voltage reference circuit.

Figure 7:
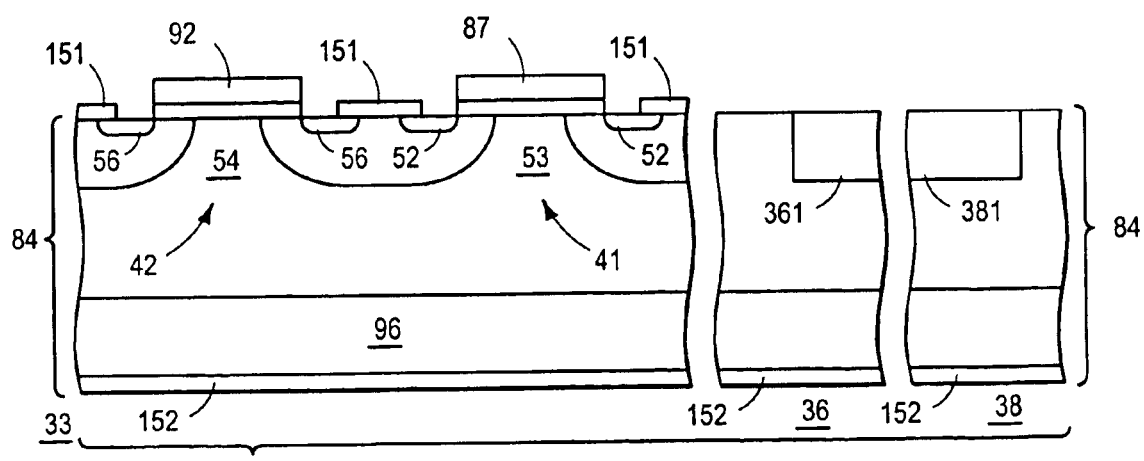
FIG. 7 illustrates an enlarged cross-sectional view of a portion of the power switching of FIG. 6 taken along reference line 6—6.

Preferably, hot swap device 31 is integrated or formed on the same semiconductor chip or one body of semiconductor material (as shown in FIG. 7). Alternatively, portions of hot swap device 31 are formed on one chip, while other portions are formed on a separate chip with separate chips integrated together in, for example, a multi-chip module.

According to the present invention, first switch or MOSFET device 41 forms part of an inrush current limiter device. For example, when the circuit card is hot swapped, current $I_{LOAD}$ flows into capacitor 46 to charge it the value of $V_{supp}$. First switch 41 together with control circuitry 37 and current limit circuit 38 limits the peak value of $I_{LOAD}$, which could otherwise reach one hundred amperes or more, to a value of about ten amperes. More specifically, in current limit mode, the channel regions of first switch or MOSFET device 41 are in a current conduction mode while the channel regions of second switch or MOSFET device 42 are turned off. As a result, for a given $I_{DSAT}$, $V_{gs}$ is greater, which puts split gate device 33 in an operating region where $V_{gs}>>V_{th}$, and $I_{DSAT}$ decreases with temperature. Split gate device or power switch device 33 then operates more robustly and reliably while avoiding hotspots and thermal runaway.

After capacitor 46 is fully charged and hot swap device 31 is no longer in current limit mode (i.e., non-current limit mode), comparator device 36 is used to turn on second MOSFET device 42, and the entire channel or current carrying layer or region of split gate device 33 is used to conduct current to provide a low $R_{DSon}$. Comparator 39 is set to turn on, for example, when the $V_{gs}$ of first switch 41 is about 5 volts, According to the present invention, this ensures that first switch or MOSFET device 41 is fully turned on and not in current limit mode before second switch or MOSFET device 42 is turned on.

Figure 3:
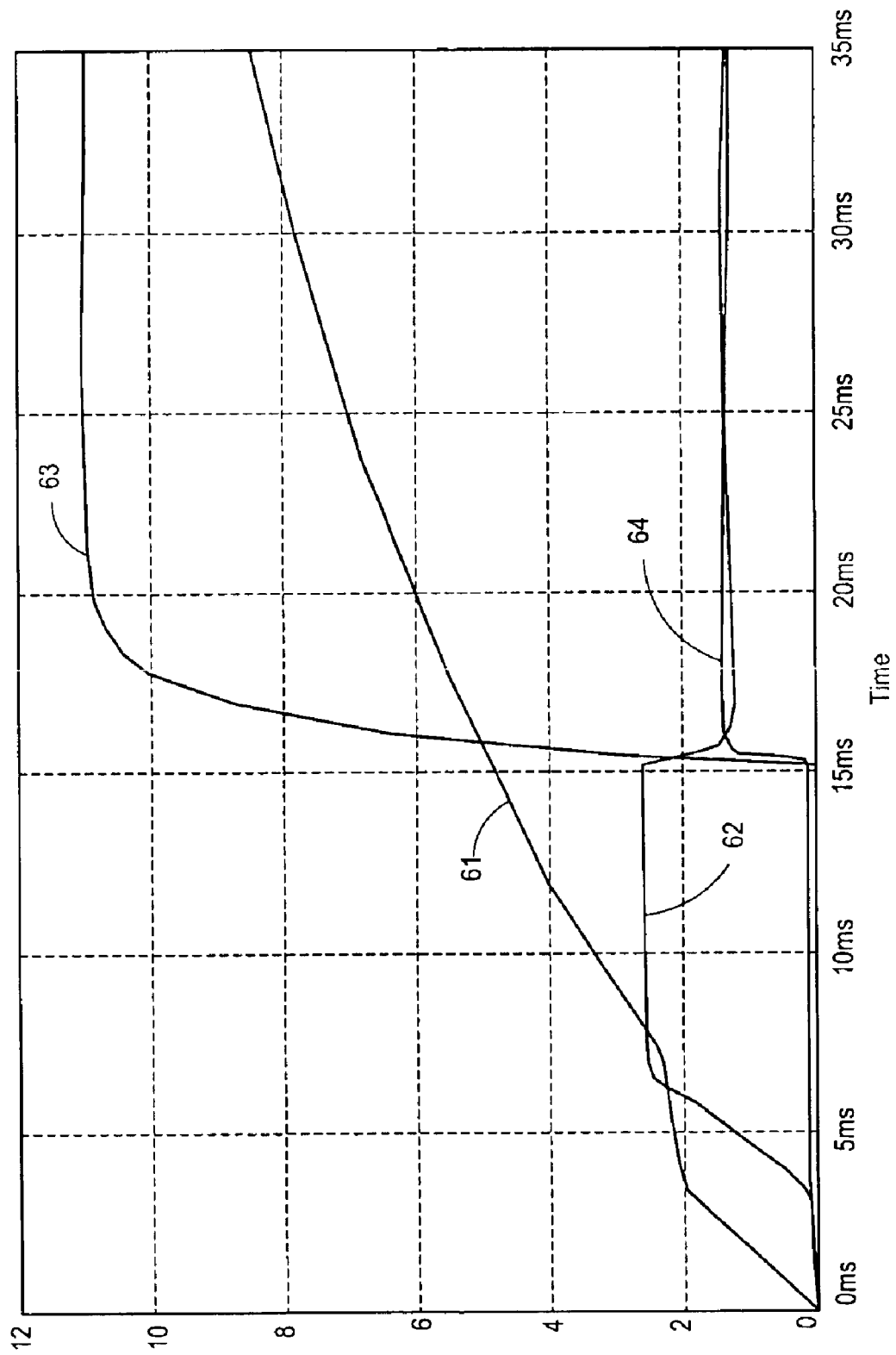
FIGS. 3–5 illustrate timing diagrams for the embodiment of FIG. 2 under various operating conditions.
Figure 4:
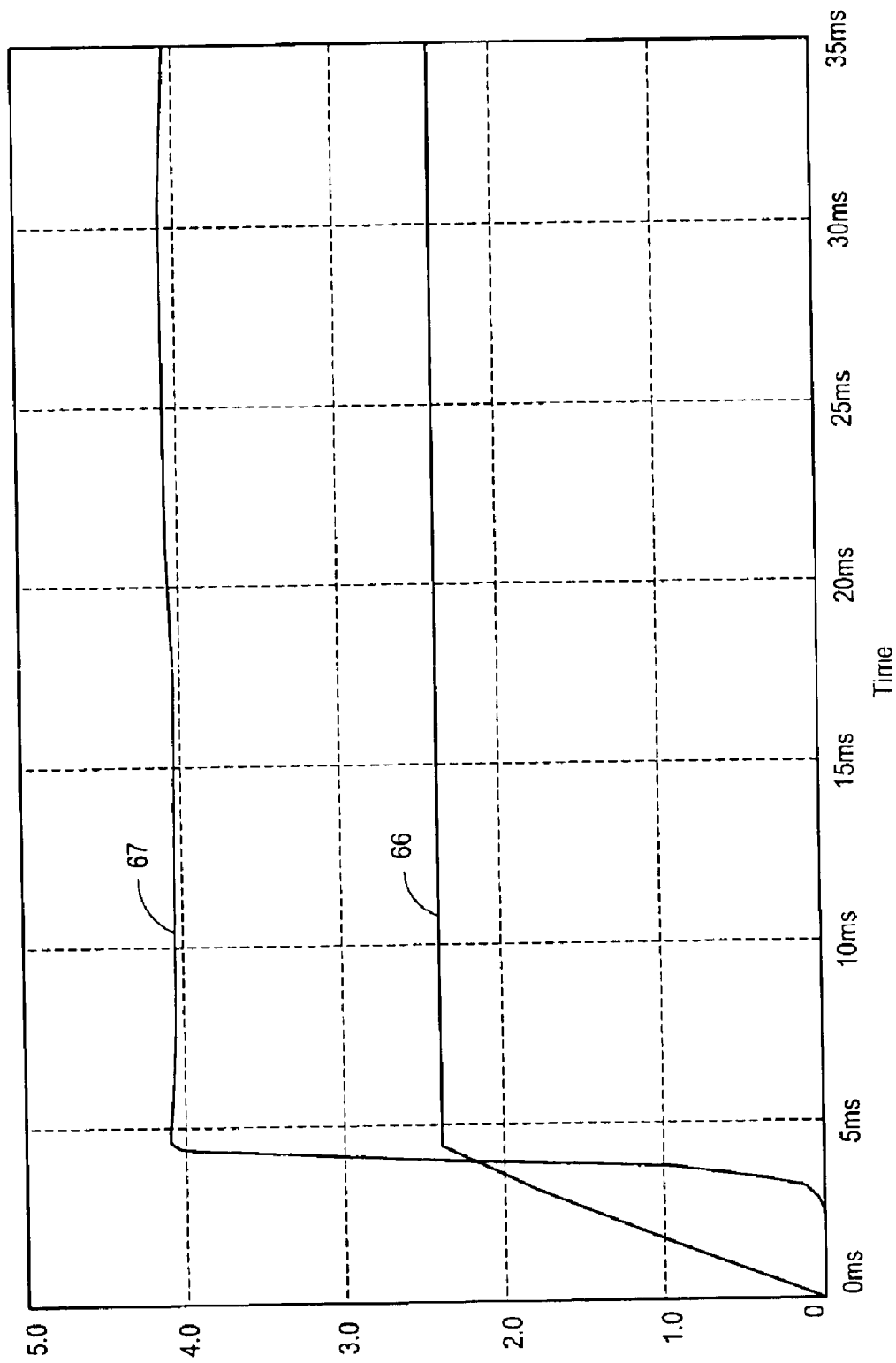
Figure 5:
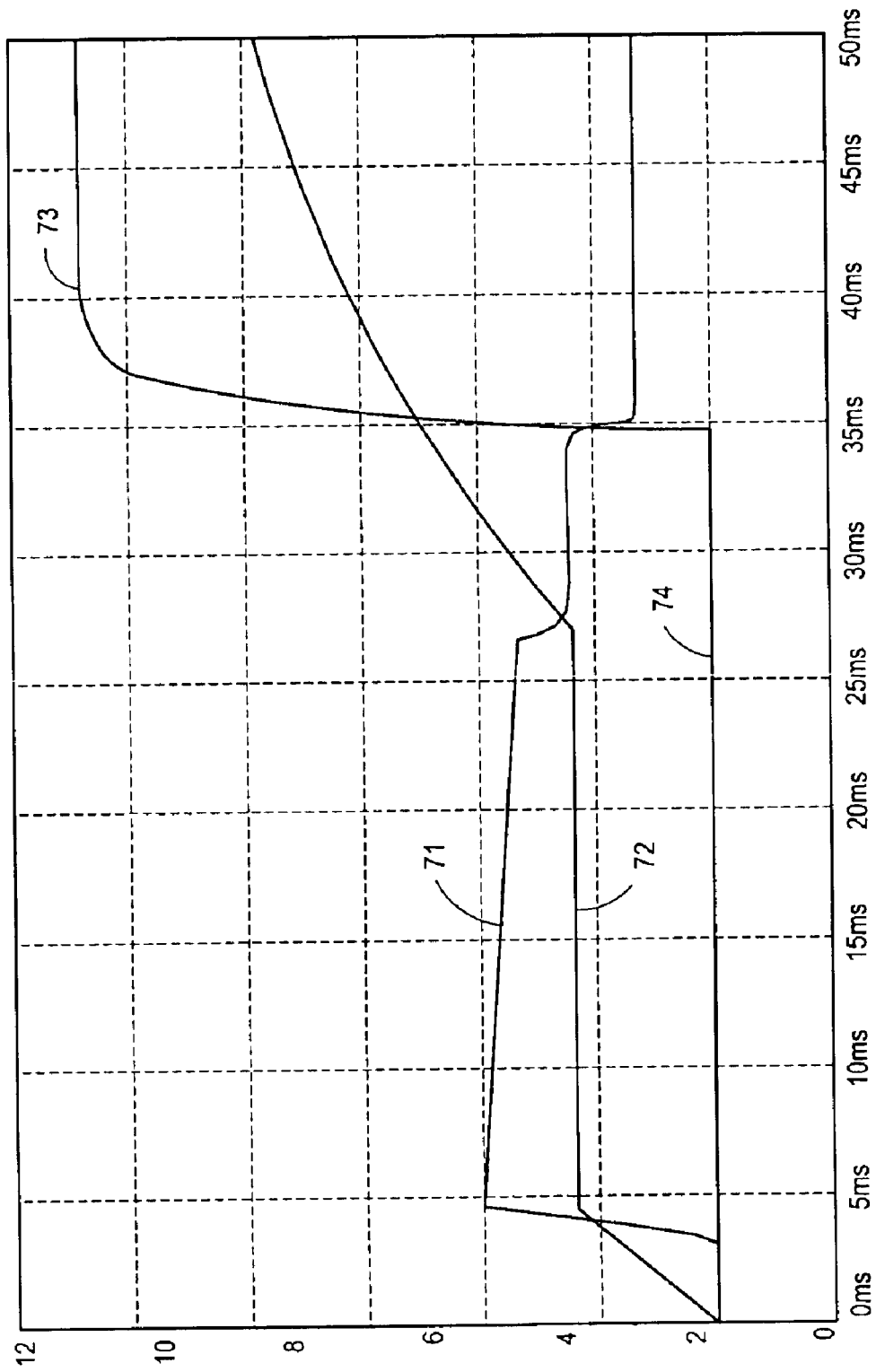

FIGS. 3–5 show simulation results for hot swap device 31 under various operating conditions. FIG. 3 shows hot swap device 31 turning on into a nominal load of 2.5 amperes. Under these conditions, current is limited by load 44, not $I_{DSAT}$. Curve 61 ($V_{gs}$ for device 41) shows gate 48 of MOSFET device 41 slowly charging through a large Rg (e.g., 10 MOhms) and curve 62 ($I_{ds}$ for device 41) shows that the entire 2.5 amperes is first conducted entirely through first switch or MOSFET device 41 according to the present invention. When the gate voltage of gate or control electrode 48 reaches about 5 volts, comparator circuit 36 turns on second switch or MOSFET device 42 (curve 63, which shows $V_{gs}$ for device 42), and about 1.25 amperes is conducted through both MOSFET devices 41 ($I_{ds}$ curve 62) and 42 ($I_{ds}$ curve 64). Eventually both gates 48 and 49 fully charge to about 11 volts, and hot swap device 31 according to the present invention operates with a very low $R_{DSon}$ (e.g., less than about 35 Mohms).

FIG. 4 shows hot swap device 31 turning on under a shorted load condition. Under these conditions and according to the present invention, first switch or MOSFET device 41 is turned on to conduct current, which is limited at about 4 amperes ($I_{ds}$ curve 67). As shown by $V_{gs}$ curve 68, the gate voltage of first switch 41 charges to about 2.4 volts while first switch 41 is in current limit mode. According to the present invention, second switch or MOSFET device 42 is not on during shorted load conditions.

FIG. 5 shows hot swap device 31 turning on into a large capacitive load 46 of 1000 uF with a load 44 of 2.5 amperes in parallel. Initially, these conditions appear as a shorted load until capacitor 46 is charged. The load then returns to a nominal 2.5 amperes. As shown by $I_{ds}$ curve 71, current in first switch 41 initially increases to 4 amperes, which corresponds a current limit mode according to the present invention. At about 27 milliseconds, capacitor 46 is charged, and the current drops to 2.5 amperes as shown by curve 71. At this time, only first switch 41 is turned on. At about 35 milliseconds, $V_{gs}$ of first switch 41 exceeds 5 volts as shown by $V_{gs}$ curve 72. At this point, second switch 42 turns on ($V_{gs}$ curve 73) according to the present invention, and current is then split between devices 41 and 42 at 1.25 amperes each as shown by $I_{ds}$ curves 71 and 74.

Figure 6:
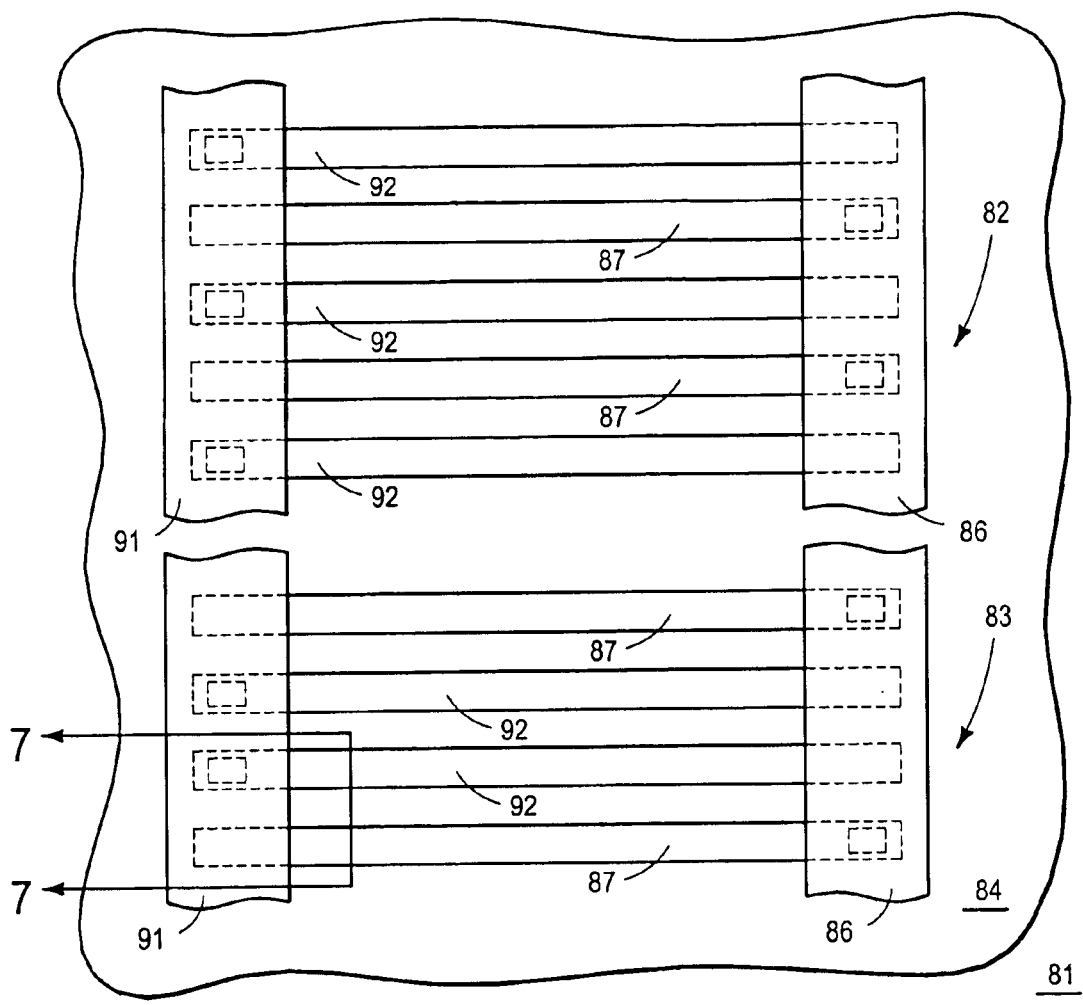
FIG. 6 illustrates an enlarged partial top view of a power switching device having a split control electrode structure according the present invention.

Turning now to FIG. 6, a preferred split gate or control electrode structure for device 33 is now described. FIG. 6 shows a highly enlarged partial top view of a split, multiple, divided, or separated gate structure 81 according to the present invention formed on a body of semiconductor material 84. Split gate structure 81 is shown with a first embodiment 82 and an alternative embodiment 83.

In embodiment 82, a first gate feed 86 is coupled to a plurality of first control or gate electrodes 87, and a second gate feed 91 is coupled to a plurality of second control or gate electrodes 92. According to the present invention, at least one of the second gate electrodes 92 is juxtaposed, next to, or adjacent to one of the first gate electrodes. Preferably as shown in embodiment 82, at least one of the second gate electrodes 92 is interdigitated between a pair of first gate electrodes 87. By structuring the gate electrodes in this manner, the current carrying load of split gate device 33 is spread out more evenly across the device. This further reduces any potential for hot spot formation and thermal runaway.

In embodiment 83, more than one of second gate electrodes 92 is interdigitated between a pair of first gate electrodes 87. Although two gate electrodes 92 are shown in FIG. 6 between a pair of first gate electrodes 87, it is understood that more than two second gate electrodes 92 may be interditigated between a pair of first gate electrodes 87 depending on system requirements.

FIG. 7 shows an enlarged cross-section view of hot swap device 31 including split gate structure 81 taken along reference line 7—7 in FIG. 6. Hot swap device 31 preferably is formed on one body of semiconductor material 84 and includes split gate device 33, comparator device 36, and current limit device 38. Split gate device 33 includes a first pair of current carrying electrodes or regions 52 and 53, and a second pair of current carrying electrodes or regions 54 and 56. First gate or control electrode 87 is formed on body of semiconductor material 84, and controls first pair of current carrying electrodes 52 and 53. Second gate or control electrode 92 is formed on body of semiconductor material 84, and controls second pair of current carrying electrodes 54 and 56. In the embodiment shown, current carrying electrodes 52 and 56 form source regions of device 33, and current electrodes 53 and 54 form drain regions. Preferably, current carrying electrodes 53 and 54 are formed in the same portion of body of semiconductor material 84 to provide a common drain region 96. Preferably, currently carrying electrodes 52, 53, 54, and 56 are formed in the same body of semiconductor material to provide an integrated device.

Figure 8:
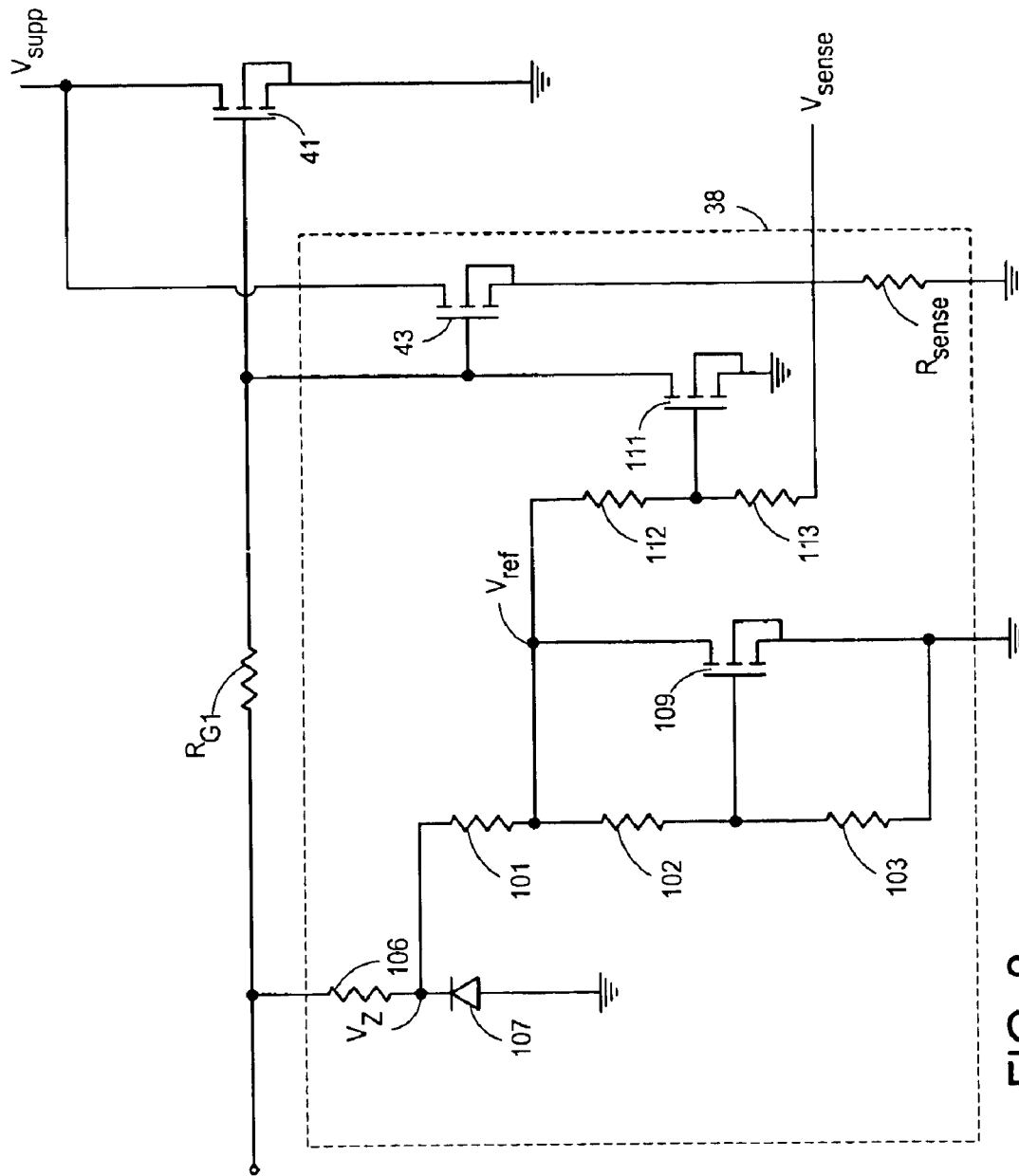
FIG. 8 illustrates a circuit diagram of a preferred current limit circuit for the embodiment of FIG. 2.

FIG. 8 shows a circuit diagram of a preferred current limit device or circuit 38 coupled to first switch 41. Resistor 106 and diode 107 set node $V_Z$ preferably to about 5.5 volts. Resistors 101, 102, and 103 and switching device 109 set node $V_{ref}$ to $(1+R_{102}/R_{103})*V_{th}$ (of device 109) by choosing specific values so that node $V_{ref}$ is a few tenths of a volt below $V_{th}$ of switching device 109.

The current through the sense cells (i.e., switch 43) is routed through Rsense to develop a voltage Vsense. As Vsense increases, the voltage at the gate of switching device 41 increases, and eventually switching device 41 turns on through switch 111. Resistors 112 and 113 function as a level shift to set the gate voltage of switch 11. Device 41 pulls current through resistor $R_{G1}$, which decreases the gate voltage thereby limiting current flow in first switch 41.

Thus it is apparent that there has been provided, in accordance with the present invention, a semiconductor switching device having low $R_{DSon}$ and a low current limit. In particular, the device includes a split gate structure that turns on a portion of the switching device during a current limit mode, and that turns on another portion of the switching device when non-current limit conditions are met. The present invention provides a device that overcomes thermal runaway problems associated with prior art switching devices.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A hot swap protection device comprising:
    a split gate switching device including a first MOSFET device having a first gate electrode and a second MOSFET device having a second gate electrode;
    a current limit device coupled to the first gate electrode for controlling the first MOSFET device during a current limit mode of operation; and
    a comparator device coupled to the first and second gate electrodes for turning on the second MOSFET device during non-current limit mode of operation.

2. The device of claim 1 wherein the split gate switching comprises:
    a plurality of first gate electrodes for controlling a plurality of first MOSFET devices; and
    a plurality of second gate electrodes for controlling a plurality of second MOSFET devices, wherein at least one second gate electrode is interdigitated between a pair of first gate electrodes.

3. The device of claim 1 further comprising a load device coupled to drain regions of the first and second MOSFET devices.

4. The device of claim 3 wherein the load device comprises a DC/DC converter.

5. The device of claim 1 wherein the first and second MOSFET devices are formed in one body of semiconductor material.

6. The device of claim 1 wherein the first and second MOSFET devices, the current limit device, and the comparator device are formed on one body of semiconductor material.

7. The device of claim 1 wherein the first MOSFET device forms an inrush current limit device.

8. A power switching structure comprising:
    a split gate switching device including a first switch having a first control electrode and a second switch having a second control electrode;
    a current limit device coupled to the first control electrode for controlling the first switch during a current limit mode of operation; and
    a comparator device coupled to the second control electrode for turning on the second switch during a non-current limit mode of operation.

9. The structure of claim 8 further comprising a load device coupled to the first and second switches.

10. The structure of claim 8 wherein the first and second switches are formed in one body of semiconductor material.

11. The structure of claim 8 wherein the first and second switches, the current limit device, and the comparator device are formed on one body of semiconductor material.

* * * * *